United States Patent [19]

Forsell

[11] Patent Number: 4,515,048

[45] Date of Patent: May 7, 1985

[54] METHOD AND APPARATUS FOR TRIMMING LEAD WIRES PROJECTING FROM PRINTED CIRCUIT BOARDS

[76] Inventor: Glenn W. Forsell, 718 Market St., Brookville, Ohio 45309

[21] Appl. No.: 519,009

[22] Filed: Aug. 1, 1983

[51] Int. Cl.³ .............................................. B23D 33/02
[52] U.S. Cl. .......................................... 83/13; 83/368; 83/422; 83/437; 83/477.1; 83/563; 83/925 R
[58] Field of Search ................... 83/13, 368, 422, 437, 83/477.1, 563, 925 R

[56] References Cited

U.S. PATENT DOCUMENTS

| | | |
|---|---|---|
| 3,307,442 | 3/1967 | Imhoff . |
| 3,453,918 | 7/1969 | Sharp . |
| 4,072,077 | 2/1978 | Morgan ........................ 83/925 R X |
| 4,200,018 | 4/1980 | Sekiwa .......................... 83/925 R X |
| 4,253,360 | 3/1981 | Zontelli . |
| 4,463,636 | 8/1984 | Heller et al. ............................ 83/13 |

Primary Examiner—Frank T. Yost
Attorney, Agent, or Firm—Jacox & Meckstroth

[57] ABSTRACT

A rotary cut-off blade is mounted on a motor shaft and is moved axially with the motor into contact with the outer surface of a printed circuit board having an inner surface engaging a vertical side wall or plate of a suction box supported for horizontal reciprocating movement. The printed circuit board supports electronic components which project into the suction box, and soldered lead wires project outwardly through holes within the board. The blade is retracted by a predetermined minute distance and then rotated by the motor while the printed circuit board is moved horizontally past the blade with the suction box to shear the projecting lead wires at the predetermined distance from the outer surface of the board and independently of the thickness of the board.

16 Claims, 5 Drawing Figures

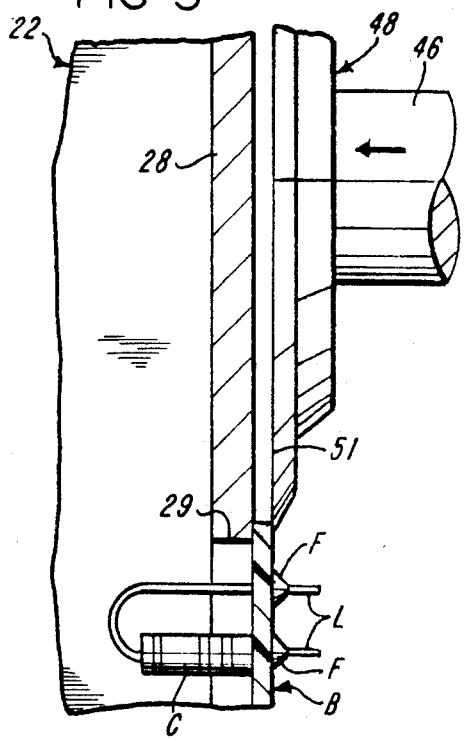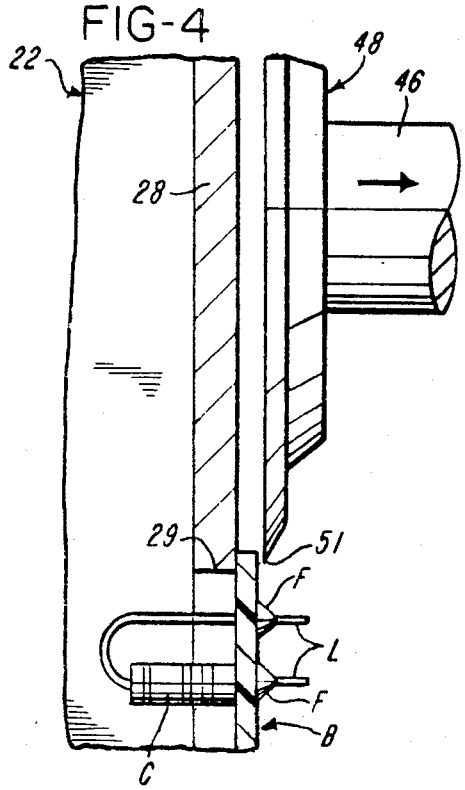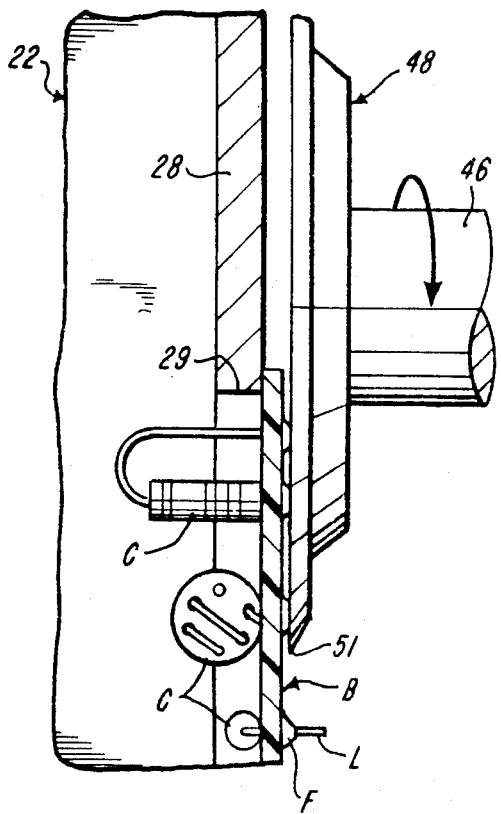

METHOD AND APPARATUS FOR TRIMMING LEAD WIRES PROJECTING FROM PRINTED CIRCUIT BOARDS

BACKGROUND OF THE INVENTION

In the production of printed circuit boards, for example, as disclosed in U.S. Pat. No. 4,253,360, various electronic components have lead wires which project through corresponding holes within the board, and the lead wires are secured to the board by solder which fills the holes and connects the lead wires to metal conductor strips formed on the outer surface of the board. As disclosed in the above patent, it is desirable to cut or shear the lead wires close to the outer surface of the printed circuit board so that the cutting blade also shears through the solder fillets surrounding the lead wires to reduce the problem of "flagging" caused by the lead wires folding over or bending before the lead wire is completely sheared or severed.

In the above patent, it is disclosed that the "flagging" problem is avoided by providing the beveled cutting edge of the rotary blade with unevenly spaced notches. In any event, the flagging problem requires substantial labor by inspectors to locate and remove the folded over end portions of the lead wires so that the end portions do not bridge the conductor strips and cause a short circuit. In order to prevent the end portions of the lead wires from remaining on the printed circuit board after the lead end portions are severed, some trimming machines provide for supporting the circuit board horizontally with the lead wires projecting downwardly during the cut-off or trimming operation, for example, as disclosed in U.S. Pat. Nos. 3,307,442 and 3,453,918. However, larger circuit boards present a problem of sagging in the middle requiring that the cutter block be spaced further from the board.

It has been found that in the production of printed circuit boards in high volume, there are variations in the thickness of the printed circuit boards, for example, variation over 0.010 inch. Accordingly, the beveled cutting edge of the cut-off blade is usually spaced from the circuit board by a sufficient distance to accommodate the variations in the thickness of the printed circuit boards. However, as mentioned above, it has been found desirable to shear the lead wires very close to the outer surface of the printed circuit board, for example, on the order of 0.010 inch, so that the beveled edge of the cutting blade shears not only through the lead wires but also through the fillets of solder for substantially eliminating the "flagging" problem.

SUMMARY OF THE INVENTION

The present invention is directed to an improved method and apparatus for trimming the soldered lead wires projecting from a printed circuit board and for shearing the lead wires through the fillets of solder at a precisely small spacing from the adjacent or outer surface of the printed circuit board and independent of the thickness of the board. The method and apparatus of the invention are particularly adapted for high volume production of high quality printed circuit boards with minimum scrap. The invention significantly reduces the labor required for inspecting and testing trimmed circuit boards by substantially eliminating the production of circuit boards with folded-over lead wires and the associated problem of short-circuiting.

In accordance with one embodiment of the invention, a printed circuit board having electronic components with soldered lead wires is inserted into an opening within the vertical side plate of a suction box supported for linear horizontal movement by a carriage mounted on parallel rails. A circular cut-off blade is mounted on the horizontal shaft of an electric motor supported for axial movement by a second carriage mounted on parallel rails perpendicular to the first rails, and the beveled cutting edge of the blade is moved axially into contact with an edge portion of the printed circuit board while the blade is stopped. The motor and blade are retracted by a predetermined minute distance, the motor is energized, and the suction box is moved horizontally along the rails so that the beveled cutting edge of the blade shears through the lead wires and the solder fillets surrounding the wires at the predetermined distance of about 0.010 inch from the outer surface of the board. After the shearing operation, the motor and blade are retracted further and stopped by a brake, the suction box is returned to its starting position and the trimmed circuit board is removed so that the cycle may be repeated with another untrimmed circuit board.

Other features and advantages of the invention will be apparent from the following description, the accompanying drawings and the appended claims.

BRIEF DESCRIPTION OF THE DRAWINGS

FIG. 3-5 are enlarged fragmentary sections showing the operation of the apparatus in FIGS. 1 and 2 for trimming the lead wires.

DESCRIPTION OF THE PREFERRED EMBODIMENT

Figure 1:
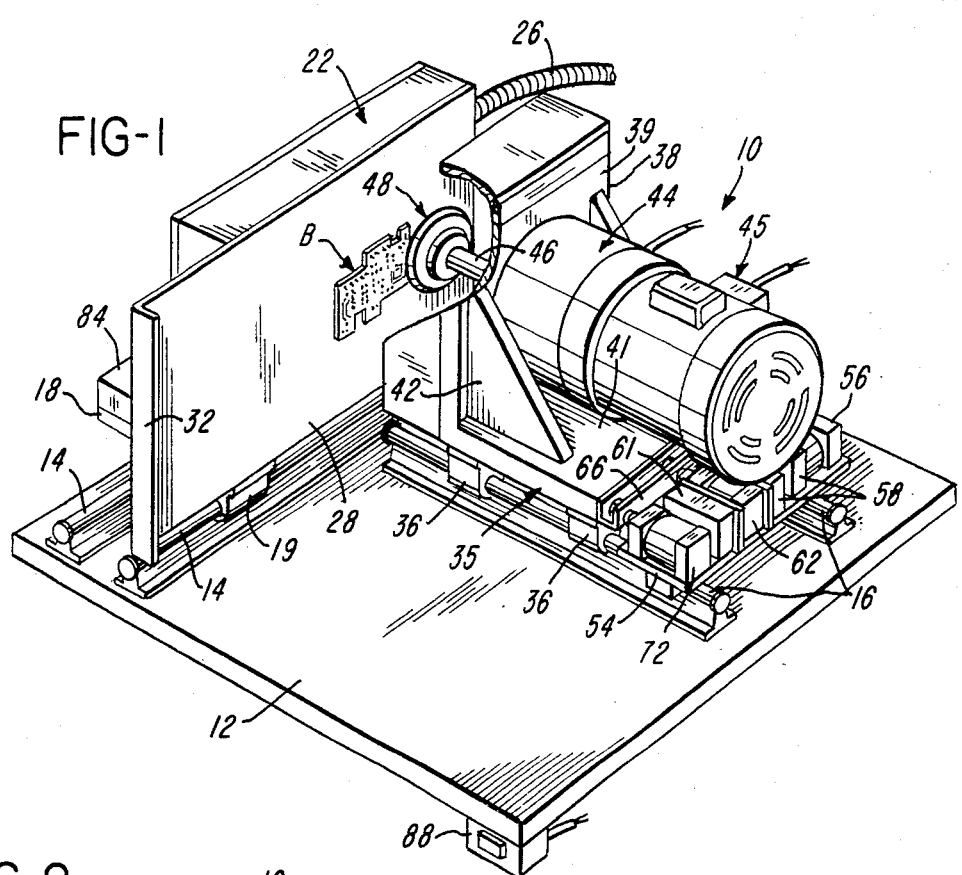
FIG. 1 is a perspective view of apparatus constructed in accordance with the invention for trimming lead wires from printed circuit boards.

A lead trimming machine or apparatus 10 constructed in accordance with the invention includes a base plate 12 which supports a first pair of parallel spaced tracks or cylindrical rails 14 and a second pair of parallel spaced tracks or cylindrical rails 16 which are mounted on the plate 12 at right angles or perpendicular to the rails 14. A rectangular carriage 18 includes a set of corner bearings 19 mounted on the rails 14 for linear reciprocating movement. The carriage 18 supports a vertical suction box 22 which defines a suction chamber 24 connected by flexible hose 26 to the inlet of a motor driven vacuum pump or blower (not shown).

The suction box 22 includes a flat vertical side wall or plate 28 having an aperture or opening 29 corresponding in shape to the configuration of a printed circuit board B. The printed circuit board B supports a series of electronic components C (FIG. 5) each of which has a pair of wire conductor leads L which extend through corresponding holes within the board and are secured to the board by solder which fills the holes and forms a generally conical fillet F surrounding each wire lead L. The shape of the opening 29 within the side plate 28 corresponds to the arrangement of the electronic components C on the board B so that a peripheral edge portion of the inner surface of the board B engages the outer surface of the plate 28 around the opening 29. As shown in FIG. 1, the forward end or edge portion 32 of the side plate 28 projects laterally to form a stop which limits reciprocating movement of the suction box 22 in a rearward direction on the rails 14. When a printed circuit board B is placed on the outer surface of the suction box plate 28 and a suction is applied to the chamber 24, the suction is effective to hold the printed circuit board B tightly against the outer surface of the plate 28 so that the board is held precisely flat in a vertical plane.

Another carriage 35 is supported for reciprocating linear movement by the rails 16 and includes a set of corner linear bearings 36 which mount on the cylindrical rails 16. The carriage 35 includes a cast angle member or block 38 having a vertical wall 39 integrally connected to a horizontal or base wall 41 with integrally cast triangular reenforcing walls 42. An electrically actuated brake unit 44 is supported by the vertical wall 39 of the angle block 38, and an electric motor 45 is supported by the brake unit 44 in a cantilevered manner. The motor 45 has a horizontal shaft 46 which extends through the brake unit 44 and the vertical wall 39 of the angle block 38. A circular cutting knife or blade 48 is mounted on the outer end portion of the motor shaft 46 and includes a sharp beveled cutting edge 51 (FIGS. 3-5).

A stationary platform 54 is mounted on and clamped to the rearward or outer end portions of the rails 16. A double acting air cylinder 56 is secured to the platform 54 and has a piston rod 57 secured to a movable or sliding clamping block 58. A stationary clamping block 61 opposes the block 58 and is secured to the platform 54, and positioned between the blocks 58 and 61 is a double acting air cylinder 62. The cylinder 62 has a piston rod secured by an adjustable nut 64 to a channel member 66 mounted on the base 41 of the carriage 35. A spacer block 68 is loosely mounted on the piston rod of the air cylinder 62 and limits rearward movement of the carriage 35 when the cylinder 62 is actuated, as will be explained later.

The platform 54 also supports a single acting air cylinder 72 having piston rod with a forward end portion secured to the channel 66 by a threaded nut 73. A compression spring 76 is mounted on the piston rod of the cylinder 72 and biases or urges the carriage 35 forwardly to a stop formed by the extended position of the piston rod.

The lead trimming machine or apparatus described above is ideally suited for precisely trimming the lead wires L which project from a supply of printed circuit boards B according to the steps illustrated in FIGS. 3-5. As mentioned above, each circuit board B is placed on the vertical side plate of the vacuum box 22 with the electronic components C projecting into the opening 29 and the inner surface of the board contacting the outer surface of the plate 28 around the peripheral edge portion of the board. A suction is produced within the suction box 26 to secure the circuit board in place firmly against the flat side plate 28. The suction blower is actuated by depressing a push button switch 84 (FIG. 2) with the operator's left hand. With the circuit board held firmly by suction against the flat plate 28, the carriage 18 is moved along the rails 14 until the carriage 18 engages a normally elevated stop pin 86 (FIG. 2) retractable by a solenoid.

When the vacuum control switch 84 is actuated or depressed by the operator's left hand, a main start switch 88 (FIG. 1) is actuated or closed by the operator's right hand. When the carriage 18 reaches the stop pin 86 by movement of the carriage with the operator's left hand, the carriage actuates a position switch 91 (FIG. 2) which releases the air cylinder 72 so that the spring 76 presses the carriage 35 forwardly until the beveled edge 51 of the cutter blade 48 engages the outer surface of the circuit board B, as shown in FIG. 3.

The automatic controls for the machine then actuate the air cylinder 56 to extend the piston rod 57 and clamp the air cylinder 62 between the blocks 58 and 61. The air cylinder 62 is then actuated to retract its piston rod and the carriage 35, motor 45 and blade 48 until the channel member 66 engages the spacer block 68 to place the cutting blade 48 in a retracted position, preferably about 0.010 inch from the outer surface of the circuit board B, as shown in FIG. 4.

The automatic controls then release the brake 44 and energize the motor 45 to rotate the blade 48 and retract the stop pin 86. After the stop pin 86 is retracted, the carriage 18 and suction box 22 are manually advanced further along the rails 14 so that the beveled cutting edge 51 shears the wire leads L and the solder fillets F, as shown in FIG. 5. When the carriage 18 engages a limit switch 92, the automatic control actuates the cylinder 56 to release the clamping pressure of the cylinder 62 and to actuate the cylinder 72 to retract the carriage 35 and motor 45 so that the blade 48 is retracted to its starting position, for example, 0.050 inch from the outer surface of the board B.

Figure 2:
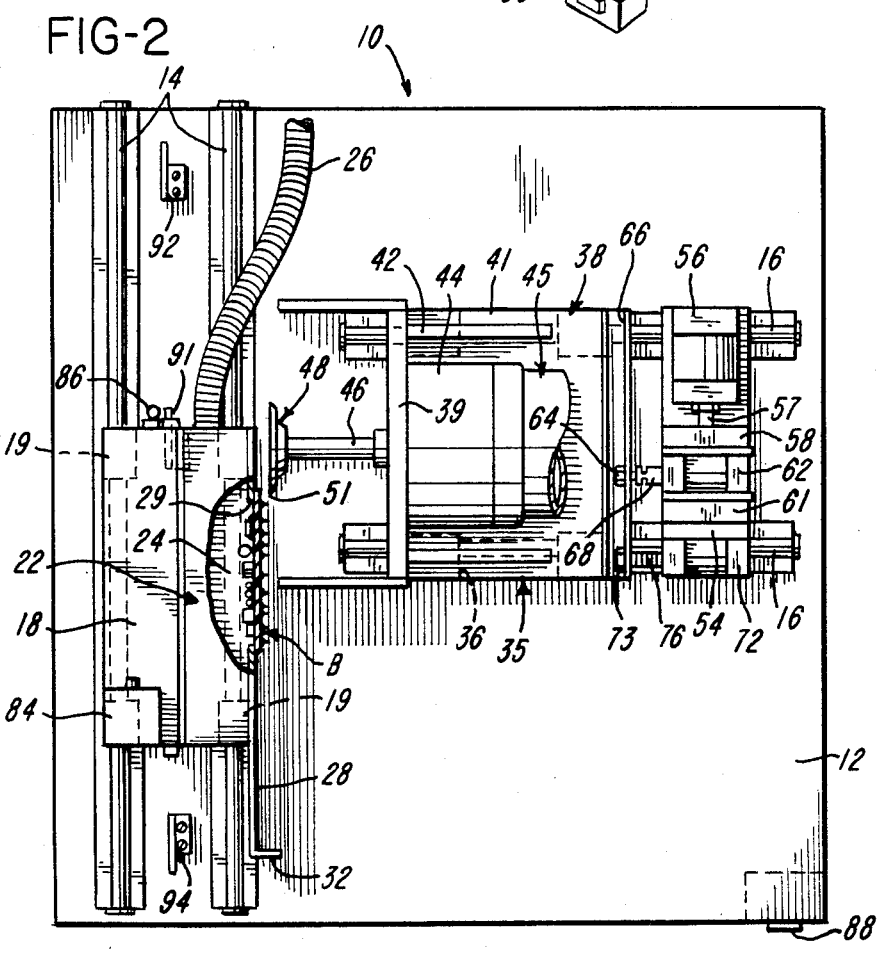
FIG. 2 is a plan view of the apparatus shown in FIG. 1.

The electric motor 45 is then deenergized, and the electric brake 44 is energized to stop rotation of the shaft 46 and blade 48 while the carriage 18 and suction box 22 are being retracted to their starting position where the carriage 18 engages a limit switch 94 (FIG. 2). When the switch 94 is actuated, the electrical control system is reset for another cycle. When the push button manual switches 84 and 88 are released, the suction to the box 22 is cut off so that the trimmed circuit board B may be removed from the side plate 28, and an untrimmed circuit board may be inserted into the opening 29 for repeating the cycle.

From the drawing and the above description, it is apparent that the method and apparatus of the invention for trimming lead wires from a printed circuit board, provide desirable features and advantages. As one primary advantage, the method and apparatus accommodate printed circuit boards of different thicknesses by first engaging the outer surface of the board (FIG. 3) and then retracting the cutting blade a minute distance of about 0.010 inch (FIG. 4) for shearing or cutting the leads and fillets while the blade is rotating (FIG. 5). The vertical flat plate 28 of the suction box 22 assures that the printed circuit board B is held precisely flat during the cutting operation to eliminate any possibility of the cutting edge of the blade engaging the conductor strips on the outer surface of the board. As a result, the leads are precisely trimmed, and the excess portions of the leads and solder fillets fall downwardly from the board where they collect on the base 12 for removal through a vacuum hose. Thus the method and apparatus eliminate the problem of "flagging" and the problem of cut end portions collecting on the outer surface of the circuit board, such as result on other trimming machines when upwardly projecting leads are trimmed from a horizontally supported circuit board.

As another feature, the construction of the apparatus, including the solid rails 14 and 16 and the support of the suction box 22 and the motor 45 on the rails, assures that the side plate 28 of the suction box remains precisely perpendicular to the axis of the motor shaft 46 during the cutting operation. In addition, the arrangement and operation of the cylinders 56, 62 and 72 provide for precise axial movement and retraction of the cutting blade 48 regardless of the thickness of the circuit board B. It is to be understood that with larger circuit boards B, intermediate stand-off posts may be used within the suction box 22 to engage the inner surface of each circuit board at the plane of the outer surface of the plate 28 to assure that the circuit board is held precisely flat by the suction within the box 22 during the cutting operation. It is also within the scope of the invention to employ means other than the air cylinders 56, 62 and 72 for moving or shifting the carriage 35, for example, such as electrically actuated solenoids.

While the method and form of lead trimming apparatus herein described constitute a preferred embodiment of the invention, it is to be understood that the invention is not limited to the precise method and form of apparatus described, and that changes may be made therein without departing from the scope and spirit of the invention as defined in the appended claims.

The invention having thus been described, the following is claimed:

1. A method of trimming lead wires projecting from one side of a printed circuit board supporting electronic components located on the other side of the board and wherein the lead wires are soldered within holes formed within the board, comprising the steps of supporting the printed circuit board by a flat supporting surface engaging the other side of the board, positioning a rotary cut-off blade with its axis substantially perpendicular to the supporting surface, relatively moving the blade and the supporting surface axially until the blade contacts the one side of the board, retracting the blade from the one side of the board by a predetermined distance to a retracted position, rotating the blade, and producing relative lateral movement between the board and the blade while the blade is rotating in the retracted position to shear the projecting lead wires at the predetermined distance from the one side of the board and independent of the thickness of the board.

2. A method as defined in claim 1 and including the step of positioning the supporting surface for the circuit board generally vertical, and positioning the rotary cut-off blade with its axis generally horizontal during the relative lateral movement between the board and the blade.

3. A method as defined in claim 1 and including the step of stopping rotation of the blade during relative movement of the blade and the supporting surface in the axial direction.

4. A method as defined in claim 1 and including the step of forming a suction box having a generally vertical side wall forming the supporting surface, forming an opening within the supporting surface for receiving the electronic components supported by the circuit board, and supporting the suction box and the rotary cut-off blade for relatively lateral movement to effect shearing of the lead wires.

5. A method as defined in claim 1 and including the step of moving the blade axially into contact with the one side of the board while the blade is not rotating.

6. A method as defined in claim 1 and including the step of forming a suction box having a generally vertical side wall forming the supporting surface, and supporting the suction box for generally horizontal movement past the cut-off blade to effect shearing of the lead wires.

7. A method of trimming lead wires projecting from one side of a printed circuit board supporting electronic components located on the other side of the board and wherein the lead wires are soldered within holes formed within the board, comprising the steps of supporting the printed circuit board by a generally vertical flat supporting surface of a suction box engaging the other side of the board, supporting the suction box for horizontal movement, supporting a rotary cut-off blade with a power driven shaft having an axis substantially horizontal and perpendicular to the supporting surface, moving the blade axially towards the supporting surface until the blade contacts the one side of the board, retracting the blade from the one side of the board by a predetermined distance to a retracted position, rotating the blade with the shaft, and moving the suction box horizontally while the blade is rotating in the retracted position to shear the projecting lead wires at the predetermined distance from the one side of the board and independent of the thickness of the board.

8. A method as defined in claim 7 wherein the blade is retracted by a distance of about 0.010 to said retracted position.

9. Apparatus for trimming lead wires projecting from one side of a printed circuit board supporting electronic components located on the other side of the board and wherein the lead wires are soldered within holes formed within the board, said apparatus comprising means forming a flat supporting surface for engaging the other side of the board, means for securing the board to the surface, a circular cut-off blade, a motor driven shaft supporting the cut-off blade for rotation on an axis perpendicular to the supporting surface, means for producing relative axial movement between the blade and the supporting surface to effect engagement of the blade with the one side of the board, means for separating the blade from the one side of the board by predetermined minute distance in the axial direction to position the blade in a retracted position, and means for producing relative lateral movement between the blade and the supporting surface while the blade is rotating in the retracted position to shear the projecting lead wires at the predetermined distance from the one side of the board and independent of the thickness of the board.

10. Apparatus as defined in claim 9 wherein the means forming the supporting surface comprise a suction box including a substantially vertical flat side plate defining an opening for receiving the electronic components on the circuit board.

11. Apparatus as defined in claim 10 and including elongated rail means supporting the suction box for horizontal movement past the cutoff blade.

12. Apparatus as defined in claim 11 and including releasable means for stopping the movement of the suction box to position an edge portion of the circuit board for engagement by an edge portion of the cut-off blade.

13. Apparatus as defined in claim 9 wherein the motor driven shaft comprises an electric motor having a shaft, a carriage supporting the motor, elongated rail means supporting the carriage for moving the motor and the blade axially, and actuating means for moving the carriage between an extended position with the blade engaging the one side of the board and a start position through the retracted position where the blade is driven by the motor.

14. Apparatus as defined in claim 13 wherein said actuating means comprise a series of fluid actuated cylinders, one of the cylinders connected to move the carriage to the start position, a second of the cylinders connected to move the carriage to the retracted position, and clamp means including a third cylinder for gripping the second cylinder after the blade has engaged the one side of the board.

15. Apparatus as defined in claim 9 and including an electric motor having a shaft for driving the cut-off blade, and electrically actuated brake means for stopping the motor shaft and the blade.

16. Apparatus for trimming lead wires projecting from one side of a printed circuit board supporting electronic components located on the other side of the board and wherein the lead wires are soldered within holes formed within the board, said apparatus comprising a suction box having a substantially vertical flat side plate for engaging the other side of the board, a circular cut-off blade, a motor driven shaft supporting the cut-off blade for rotation on an axis perpendicular to the side plate, means for moving the shaft and the blade axially relative to the side plate to effect engagement of the blade with the one side of the board while the blade is stopped, means for retracting the shaft axially to move the blade from the one side of the board by predetermined minute distance to a predetermined retracted position, and rail means supporting the suction box for linear movement to move the board laterally while the blade is rotating in the retracted position to shear the projecting lead wires at the predetermined distance from the one side of the board and independent of the thickness of the board.

* * * * *